United States Patent [19]

Leder

[11] 4,013,463
[45] Mar. 22, 1977

[54] PHOTORECEPTOR FABRICATION UTILIZING AC ION PLATING

[76] Inventor: Lewis B. Leder, 1400 East Ave., Rochester, N.Y. 14610

[22] Filed: Aug. 15, 1975

[21] Appl. No.: 605,134

[52] U.S. Cl. .................................. 96/1.5; 427/38; 427/39; 427/74; 427/76; 346/160
[51] Int. Cl.$^2$ ......................................... G03G 5/04
[58] Field of Search ................. 96/1.5; 427/76, 35, 427/38, 39, 74; 346/74 P

[56] References Cited

UNITED STATES PATENTS

| | | | |
|---|---|---|---|
| 2,636,855 | 4/1953 | Schwarz | 204/192 |
| 3,419,487 | 12/1968 | Robbins et al. | 204/164 |
| 3,428,546 | 2/1969 | Baum et al. | 204/192 |
| 3,472,679 | 10/1969 | Ing et al. | 118/49.5 |
| 3,528,387 | 9/1970 | Hamilton | 118/49.1 |
| 3,799,862 | 3/1974 | Krutenat | 204/298 |
| 3,816,288 | 6/1974 | Lubicz et al. | 96/1.5 |

FOREIGN PATENTS OR APPLICATIONS

| | | | |
|---|---|---|---|
| 1,036,569 | 5/1969 | Japan | 204/192 |
| 1,065,745 | 4/1967 | United Kingdom | |

OTHER PUBLICATIONS

IEEE Transactions – AC Sputtering, H. Y. Kumagai, pp. 7–10, Sept. 1972.

*Primary Examiner*—David Klein
*Assistant Examiner*—Judson R. Hightower

[57] ABSTRACT

A durable photoreceptor having improved flexibility comprising a metal- or metal-coated flexible substrate and an inorganic photoconductor layer in charge blocking contact, the photoreceptor being obtained by initially bombarding the metal substrate, as an electrode, with both negative and positive ions of a nonmetallic gas of low ionization potential under AC glow discharge in the presence of oxygen; and exposing the resulting oxidized substrate to a vapor cloud of inorganic ambipolar photoconductive material consisting essentially of positively and negatively charged and uncharged photoconductive material in a low frequency AC electrical field, utilizing the substrate as one electrode, a source of said vapor cloud of photoconductive material or adjacent structure as the other electrode, the latter functional step being effected in combination with at least part of the initial bombardment step.

19 Claims, No Drawings

PHOTORECEPTOR FABRICATION UTILIZING AC ION PLATING

BACKGROUND OF THE INVENTION

This invention relates to improved photoreceptors utilizing flexible substrates and relatively brittle ionizable inorganic photoconductive material, the photoreceptor being obtained in accordance with a three-step ion bombardment cleaning, oxidation, ion-deposition process.

Photoreceptors, particularly those related to xerographic copying, traditionally comprise a photoconductive insulating layer such as an element or alloy thereof exemplified by selenium (amorphous or trigonal) and selenium alloys such as a Se—As, Se—Te, Se—Bi, etc., with varying amounts of a halogen. Such materials are customarily applied in charge blocking contact to a supporting metal- or metal-covered substrate. Suitable substrates for such purpose include, for instance, aluminum, steel, nickel, brass, NESA glass or corresponding metal-coated polymeric materials.

Photoreceptor comprising at least the above elements are generally given a uniform electrostatic charge and the sensitized surface then exposed to an image pattern defined by an electromagnetic radiation, such as light. Light impingement results in a selective dissipation of the initially applied charge leaving a positive electrostatic image. The electrostatic image is then customarily developed by applying oppositely charged marking particles onto the charge-bearing photoreceptor surface.

The above basic concept was originally described by Carlson in U.S. Pat. No. 2,297,691, and has been since amplified and redescribed in many related patents in the field. Generally speaking, photoconductive layers suitable for carrying out the above functions have a specific resistivity of about $10^{10} - 10^{13}$ ohm-cm, in the absence of illumination. In addition, their resistivity must drop at least several orders of magnitude where exposed to an activating radiation such as light.

Photoconductive layers meeting the above criteria also normally exhibit some loss in applied charge, even in the absence of light exposure. This phenomenon is known as "dark decay" and will vary somewhat with sensitivity and with usage of the photoreceptor. The existence of the problem of "dark decay" is well known and has been controlled to a substantial extent by incorporation of thin barrier layers such as a dielectric film between the base or substrate and the photoconductive insulating layer. U.S. Pat. No. 2,901,348 of Dessauer et al utilizes a film of aluminum oxide of about 25 to 200 angstrom or an insulating resin layer, such as a polystryene of about 0.1 to 2 microns thickness for such purpose. With some limitations, these barrier layers function to allow the photoconductive layer to support a charge of high field strength while minimizing "dark decay." When activated by illumination, however, the photoconductive layer and barrier layer must become sufficiently conductive to permit substantial dissipation of the applied charge in light-struck areas within a short period of time.

In addition to the above-indicated electrical requirements, it is also becoming increasingly important that photoreceptors meet rather stringent requirements with regard to mechanical properties such as flexity and durability. Such additional criteria become particularly important in modern automatic copiers operating at high speeds where the photoreceptor is in the form of an endless flexible belt (ref. U.S. Pat. No. 2,691,450). While belt-type photoreceptors have many advantages, there are also serious technical problems inherent in their use. For example, high speed machine cycling conditions require particularly strong adhesion between the photoconductive layer and the underlying substrate. Unfortunately, however, some of the most sensitive and efficient photoconductive materials are relatively brittle as films and do not generally adhere well to flexing metal substrates. It is very important, however, that any interface between the electrically conductive supporting substrate and the photoconductive layer be stable and strongly adherent to both since changes at this point will have a substantial effect on the electrical properties of the photoreceptor.

The above problems have been considered and resolved to a substantial extent in a process described in a copending application having the same filing date by Lewis B. Leder, John C. Schottmiller and Harold H. Schroeder entitled "Improved Photoreceptor Fabrication" (U.S. Ser. No. 447,736, filed June 10, 1074 and now abandoned) wherein the substrate is initially bombarded by non-metallic ions under a DC glow discharge in the presence of air or an inert rare gas containing at least 1% by volume available oxygen. The initial step, as described, is followed or overlapped by further bombardment of the substrate with a mixture of high energy photoconductive cations, and non-metallic high energy cations such as nitrogen or argon plus uncharged vaporized photoconductive material. While the above-described process represents a substantial technical breakthrough in utilizing the more efficient brittle photoconductors in flexible belt-type photoreceptors, there still remains room for improvement. In particular, the production of high energy photoconductive cations in a glow discharge for bombardment purposes is relatively inefficient (up to 5% at best) and requires expensive electrical equipment of limited capacity. Moreover, the insulative nature of preferred inorganic photoconductive materials make it difficult to avoid the accumulation of some surface charges on the substrate in a DC glow discharge environment. In effect, this results in a substantially lowered efficiency in depositing ionic photoconductive material of like sign onto the substrate.

Neither the use of an oppositely charged screen nor an increase in field strength will completely avoid this problem.

It is an object of the present invention to obtain improved flexible durable photoreceptors suitable for high speed xerographic copying puposes.

It is a further object of the present invention to develop a new and more efficient method for utilizing brittle photoconductive elements in a class of high speed flexible photoreceptors without the need for complicated chemical pretreatment of the substrate.

THE INVENTION

These and other objects of the instant invention are achieved in obtaining flexible photoreceptors having improved durability and adhesion between components comprising a flexible metal- or metal-covered substrate and an inorganic ambipolar ionizable photoconductive layer in charge blocking contact with the substrate by initially bombarding the substrate as an electrode under DC or low frequency AC glow discharge with ions of an inert non-metallic gas in the presence of available oxygen; and exposing the resulting oxidized substrate as an electrode to a vapor cloud consisting essentially of (1) positive and negative ions of the desired ambipolar photoconductive material, (2) ions of an inert non-metallic gas comprising the glow discharge, and (3) uncharged vaporized photoconductive material, in or adjacent to a low frequency AC electrical field utilizing the donor source of the vapor cloud of photoconductive material or adjacent structure other than the substrate as an additional electrode. Such vapor source includes, for instance, a resistance heated stainless steel or graphite crucibles containing the photoconductive material as electrodes.

Suitable substrates for purposes of the present invention usefully consist of relatively thin metal foils of copper, steel, brass, aluminum, nickel, or a corresponding metal-coated flexible polymeric base such as a coated polyethylene terephthalate. Of particular interest as substrates are aluminum-coated polyethylene terephthalate belts and nickel belts.

Ambipolar ionizable photoconductive material suitable for use in the instant inventive process are exemplified by selenium and corresponding alloys thereof with arsenic, tellurium, germanium, antimony, bismuth, and/or one or more halogens such as chlorine, bromine, or iodine. Such photoconductive materials are obtainable by subjecting selenium, plus small amounts of one or more of the above alloy elements and/or a halogen to heat in a sealed container.

For purposes of the present invention, the finished photoreceptor includes at least one thin oxide layer as a charge blocking layer in general accordance with the teaching of U.S. Pat. No. 2,901,348. When flexible metal belts such as nickel belts are used, however, special chemical treatment has hitherto been required in order to obtain adequate adhesion of the photoconductive layer to the substrate and a controlled amount of oxide blocking layer or layers. This problem is avoided by the initial bombardment of the substrate, as an electrode under DC or low frequency AC glow discharge, with positive ions of a non-metallic gas as above described. This step is best carried out, for instance, by evacuating a suitably modified vacuum coater down to a pressure of about $5 \times 10^{-5}$ Torr and then backfilling with up to about 30 microns (mercury) of air. A pressure of about 5 – 20 microns is generally preferred for this purpose, depending upon the gases utilized. While air under reduced pressure is acceptable, it is also found convenient, on occasion, to utilize various alternative mixtures of inert ion producing and oxidizing gases at comparable pressures. Such include, for instance, argon-oxygen, argon-air, argon—$CO_2$, or a mixture of nitrogen and oxygen, etc. In each case, however, the amount of available oxygen for initial oxidation of the substrate should not be less than about 1% by volume of the available gases, and a glow discharge must be maintainable.

Maintenance of a satisfactory glow discharge for purposes of effecting the initial ion bombardment and oxidation of the substrate can be satisfactorily effected for purposes of the present invention under a DC field at a potential ranging from about 1500 to about 3500 volts and a cathode current density of about 0.05 – 0.5 ma/cm$^2$, depending upon the type and pressure of gas used to form the ions. Alternatively, a low frequency AC glow discharge of about 60 – 400 cycles, a potential of about 500 to about 1400 volts and a substantially reduced current density of about 0.01 – 0.15 ma/cm$^2$ is also found to be sufficient.

Prior to completion of a period of time sufficient to form a uniform oxide barrier layer of about 10 – 200 angstrom thickness on the substrate, and assuming that the substrate has been brought up to a suitable temperature (55° – 60° C.) by ion bombardment (about 5 – 20 minutes and preferably 8 – 10 minutes under the conditions indicated above), the oxide bearing substrate is simultaneously exposed to a vapor cloud of charged and uncharged photoconductor particles evolved from a heated photoconductive source by introducing the vapor into and adjacent to an area of a low frequency AC glow discharge. Under such conditions, it has been found that both negative and positive high energy ions of the ambipolar photoconductive material are formed in good yield under conditions favoring efficient deposition onto the substrate electrode. In this manner, the efficiency of high energy ionic deposition is increased about two-fold over that which would occur under a DC glow discharge alone, and the troublesome buildup of surface charges on the partially covered substrate is controlled.

In the above-described situation, the simultaneously occurring substrate bombardment by non-metallic ions such as argon or nitrogen ions will still displace the more loosely adherent photoconductive particles already condensed onto the substrate in favor of charged photoconductive particles having greater original energy content. This process is important and occurs despite the relatively low concentration of high energy photoconductor ions obtained relative to the total amount of thermally created photoconductive particles.

For purposes of the present invention, the deposition of photoconductive material onto the oxide-coated substrate is best effected by separately heating the source of photoconductive material to a temperature between room temperature and the maximum evaporation temperature of the photoconductive material. For such purpose, the preferred temperature range (1) favors maximum vapor concentration and field conditions commensurate with maintenance of a low frequency AC glow discharge proximate to the heated donor electrode and the substrate electrode, and (2) favors the highest possible conversion of uncharged photoconductive vapor into positive and negative ions and the production of non-metallic gas ions to effect the impaction of the highest possible concentration of high energy photoconductive particles onto the substrate. As above indicated, it is also much to be desired to minimize the accumulation of positive or negative charges on the surface of the partially coated substrate.

For purpose of the latter photoconductor ion deposition step, it is found that an AC field up to about 500 cycles and having a potential not exceeding about 1400 volts under glow discharge is adequate. Preferably, however, a 60 – 400 cycle AC, 500 – 1000 volts field and a current density of about 0.01 to about 0.15 ma/cm$^2$ is considered optimal.

In further reference to the second or photoconductor deposition step, it should be kept in mind that the concentration or argon or similar non-metallic inert gas ions must be maintained in the coater at a pressure sufficient to maintain an AC glow discharge even though the oxygen component may be substantially reduced in concentration or eliminated altogether for the latter photoconductor deposition step. An adequate concentration is generally obtainable although not limited to maintenance of a pressure of about 5 - 30 microns (mercury).

As a practical matter, the above-described second phase of the instant inventive process is conveniently accomplished when desired by increasing the amount of vacuum to $5 \times 10^{-5}$ Torr and then backfilling the coating chamber with up to about 5 - 30 microns of argon, nitrogen, xenon or similar glow discharge maintaining inert gas. This technique effectively reduces the relative concentration of oxygen and assures adequate displacement of the more loosely adhering photoconductive material.

In order to effectively raise the vapor pressure of the photoconductive material for deposit onto an oxidized substrate, it is also convenient if the source is independently heated. This can be accomplished, for instance, by resistance heating by the use of an electron beam or gun directed at the source or by separate ion bombardment to vaporize the photoconductive material. In any case, the optimum temperature for this purpose will vary with the particular photoconductive material used, the distance between source and substrate, and the atmospheric composition and pressure utilized. By way of example, a source temperature of up to about 350° C. and preferably about 180° - 350° C. is found adequate for vaporizing selenium and most of the known selenium alloys at a pressure up to about 30 microns (mercury).

During the period of photoconductor deposition onto the clean oxide-coated substrate, it is essential that a glow discharge be maintained for the purpose of creating photoconductor ions but without seriously limiting the rate and area of deposition of the photoconductive material onto the substrate.

One embodiment of the relationship of the electrodes and other essential components of the above-described two major phases of the inventive process are very generally represented in modified form in Diagrams IA and IB. In IA either a DC or AC current is utilized to form the oxide layer on the substrate. In Diagram IB a low frequency AC current is utilized to effect deposition of photoconductor material onto the oxide covered substrate. Where an AC field is utilized, however, it is not possible to visually identify individual areas of the glow discharge.

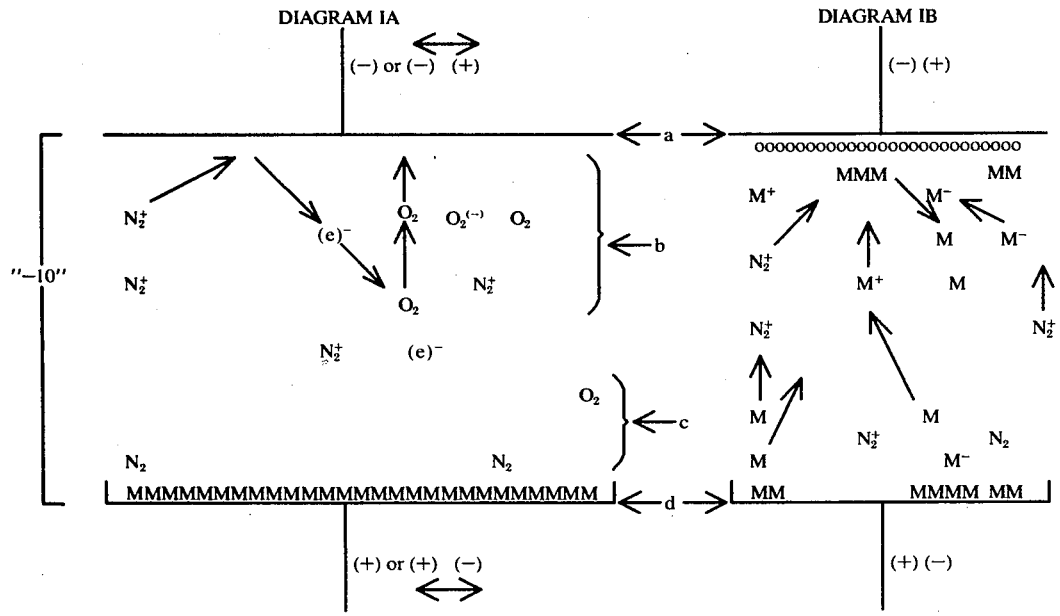

In the above diagrams, therefore, (a) and (d) conveniently represent the substrate electrode and a heated photoconductor source containing photoconductor material (M), while areas (b) and (c) represent the Cathode Dark Space and Negative Glow areas when a DC Glow Discharge is used.

The initial bombardment of the substrate is preferably carried out at a pressure of about 10 - 20 $\mu$, at a potential of about 500 - 3500 volts (500 - 1400 v AC) and a current density of about 0.01 - 0.3 ma/cm$^2$ (preferably 0.01 - 0.15 ma/cm$^2$) to form a clean oxide blocking layer under glow discharge. This step, whether effected under AC or DC, has the triple function of (1) cleaning the substrate, (2) heating it to an appropriate temperature for coating, and (3) forming an oxide charge-blocking layer. Looking to the specifics of this step it is noted that when a DC voltage is applied, a breakdown of available inert non-metallic gases occurs and an "abnormal glow" is preferably established, whereby current flow is positively correlated with voltage. The formation and characteristics of such "abnormal glow" discharges are described, for instance, by G. Francis in "The Glow Discharge at Low Pressure"; Vol. 22, *Encyclopedia of Physics* (Springer-Verlag, Berlin [1956]).

For purposes of the present invention, it is further noted that the preferred electrode spacing is such that only the Cathode Dark Space and Negative Glow can be visually identified in the DC mode and not at all in the AC field applied between the substrate and the photoconductor source.

It is also known that almost all of the applied potential is dropped across the area corresponding to the Cathode Dark Space and that the highest concentration of gas ions exist in the area corresponding to the Negative Glow region. Thus, an ion produced in the Negative Glow region will be accelerated across the Cathode Dark Space and impact the substrate at an energy level considerably higher than that of a thermally excited atom or molecule. It is noted, in this connection, that the glow discharge current can be monitored to determine when a substrate surface has been cleaned by ion bombardment (Diagram IA) since the glow discharge current will gradually decrease to a lower steady state value. This is because the clean metal substrate surface has a lower secondary electron emission coefficient than a dirty or oxide coated surface.

As previously noted, the second phase of the instant process is optionally begun (ref. Diagram IB) shortly before completion of the oxide barrier layer on the substrate. This step is effected by evaporation of photoconductive material into and around the glow discharge region. Since the evaporated photoconductor material is ambipolar, both positive and negative ions will be formed in the glow discharge. Moreover, the speed of ion migration is so much higher than the field frequency both positive and negative photoconductor ions can impact the substrate at a high energy level. This effectively almost doubles the number of high energy photoconductor ions available for impacting the substrate.

By effecting the above deposition in the presence of positive non-metallic gas ions such as argon or nitrogen, it is also possible to displace a substantial amount of low energy deposited (unionized) photoconductive material from the substrate in favor of the available charged high energy photoconductor ions.

Successful impact deposition, however, requires a balance between removal and deposition so as to obtain a net coating comprising a larger proportion of initially ionized photoconductor material. The time required to obtain an adequate photoconductive layer will largely depend directly or indirectly on these factors.

While the chief advantage of depositing an ionized vitreous photoconductor on a metallic substrate is realized in improved adhesion durability and acceptable or improved interface electrical properties, only a relatively thin layer of photoconductive material need be deposited under a glow discharge.

As desired, after depositing photoconductive material under glow discharge to a thickness of at least about $0.01\mu$ and preferably after depositing about 0.25% − 10% of the total thickness of photoconductive material onto the oxidized substrate (i.e., about 2 − 5 minutes), pressure is conveniently lowered in the coater to $5 \times 10^{-5}$ Torr or better, and vapor deposition of the balance of the photoconductor material optionally allowed to proceed in the conventional manner. For xerographic purposes, a total photoconductor coating of about 40 − 60$\mu$ on the substrate is optimal, although not exclusive.

If desired, however, more of the photoconductive layer may be deposited by means of the above-described process.

The following examples specifically demonstrate preferred embodiments of the present invention without limiting it thereby.

EXAMPLE I

A stain-free nickel alloy test belt identified as A-1 having a thickness of 4.5 mil (0.0045 inch), a length of 10 inches and a circumference of 15 inches, is cleaned with a hot aqueous solution containing 10% by weight of "Mitchell Bradford No. 14 Cleaner" and then rinsed in deionized water for about 2 minutes.

A sample belt identified as A-1 is mounted in a vacuum coater on a rotatable mandrel insulated from ground and about 6 inches away from 3 stainless steel crucibles equipped with resistive heating means and containing photoconductive selenium alloy consisting of about 99.5% selenium and 0.5% arsenic. After evacuating the coater to $5 \times 10^{-5}$ Torr and backfilling to about 10 $\mu$ air pressure, a glow discharge is formed using the belt and the alloy-containing stainless steel crucibles as electrodes in a 700 volt 60 cycle AC field at .05 ma/cm$^2$. After 10 minutes under glow discharge, the steel crucibles are heated up to about 250° C. for 3 minutes. Thereafter, the field is turned off and the coater pressure again evacuated to $5 \times 10^{-5}$ Torr and normal vacuum deposition permitted at 300° C. for 10 additional minutes. Throughout the entire treatment the mandrel and mounted substrate are constantly rotated at about 10 revolutions per minute to obtain a uniform photoconductive layer 50 $\mu$ in thickness. The coater is then permitted to return to ambient conditions and the photoreceptor removed and tested for electrical properties and adhesion. The results are reported in Table I infra.

EXAMPLE II

Two nickel test belts of identical size and shape as test belt A-1, and identified as A-2 and A-3 respectively, are cleaned as in Example I and coated as follows:

Belt A-2 is coated as in Example I except that a 20 $\mu$ backfill of oxygen (10% by volume) and argon (90% by volume) mixture is utilized in place of air during the initial cleaning, heating and oxidation phase. The AC electrical field is operated under 60 cycles at 1000 volts and with a current density of 0.15 ma/cm$^2$. After 10 minutes under glow discharge, the oxygen flow is stopped and glow discharge continued under argon at 20 $\mu$. The AC voltage is then decreased to 500 volts and 0.10 ma/cm$^2$ current density, and the crucible heated up to about 240° C. for 5 minutes, during which time the photoconductor material is partially vaporized into the glow discharge. Thereafter, the electric field and argon flow are cut off and regular vacuum deposition effected at 280° C. for 10 additional minutes. The coater is then permitted to return to ambient conditions, and the photoreceptor belt removed from the chamber and tested as in Example I. The results are reported in Table I infra.

Belt A-3 (control) is cleaned and oxidized under glow discharge in an identical manner as belt A-2, the glow discharge then being cut off and regular vacuum deposition effected at $5 \times 10^{-5}$ Torr for about 20 minutes at crucible temperatures of 280° C. to obtain a photoreceptor having a photoconductor layer of about 50 $\mu$ thickness. The cooled photoreceptor belt is removed and tested as in Example I and the results reported in Table I infra.

EXAMPLE III

Belt A-4 is treated exactly as belt A-1 except that the belt is not chemically cleaned or washed prior to mounting in the vacuum chamber for oxidation of the substrate. After coating as in A-1, the photoreceptor is cooled, removed and tested as before, and the results reported in Table I.

EXAMPLE IV

Test belt A-5 is treated exactly as in Example I except that the initial oxidation step (i.e. ion bombardment cleaning, heating and oxidation) is effected under a DC glow discharge at 200 volts at a current density of 0.25 ma/cm$^2$. An initial photoconductor layer is then applied under an 800 volts 60 cycle glow discharge at a current density of 0.06 ma/cm$^2$ for 2 minutes. The remaining photoconductor material is then applied by vapor deposition to obtain a 50 $\mu$ as in Example I. The resulting photoreceptor belt is cooled, removed and tested as before, the results being reported in Table I.

EXAMPLE V

An identical nickel test belt identified as A-6 is chemically cleaned and rinsed as in Example I and then heated in air for 25 minutes at 350° C. and cooled to effect thermal oxidation (60 Å). The oxidized belt is then mounted for 20 minutes in a coater at $5 \times 10^{-5}$ Torr at a crucible temperature of 300° C. to obtain a 50 $\mu$ photoconductor coat. The photoreceptor is then cooled, removed and tested as before, and the results reported in Table I.

TABLE I

| Test Belt | Capacitive Charge (v/u) | 20 sec. Dark Decay v/sec | Mandrel Test (1 ½" diameter) |
|---|---|---|---|
| A-1 | 30.1 | 10 | P |
| A-2 | 24.4 | 12 | P |
| A-3 (control) | 25.5 | 14 | F |
| A-4 | 26.2 | 11 | P |
| A-5 | 23.4 | 16 | P |
| A-6 | 24.1 | 15 | F |

P = pass (no cracks or spalls observed)
F = fail (one or more cracks or spalls observed) when belt is bent around a 1 ½" pipe once at room temperature.

EXAMPLE VI

Example I is repeated using respectively steel, aluminum, and brass test belts of the same dimensions as the nickel test belts A-1 through A-6. The results obtained are found to be consistent with Example I with respect to resistance to cracking and spalling.

What is claimed is:

1. A method for obtaining flexible photoreceptors having improved durability and adhesion between components thereof comprising a flexible metal- or metal-coated substrate and an inorganic ambipolar ionizable photoconductive layer in charge-blocking contact with the substrate, comprising
   initially bombarding the substrate as an electrode under DC or low frequency AC glow discharge under vacuum with ions of an inert non-metallic gas in the presence of available added or residual atmosphere oxygen; and
   exposing the resulting oxidized substrate as an electrode to a vapor cloud from a donor source comprising positive and negative ions of desired ambipolar photoconductive material, ions of the inert non-metallic gas comprising the glow discharge, and uncharged vaporized photoconductor material; in or adjacent to a low frequency AC electrical field utilizing the donor source of the vapor cloud of photoconductive material or adjacent structure as an additional electrode.

2. The method of claim 1 wherein the exposure of the oxidized substrate to the vapor cloud is effected in conjunction with at least part of the initial substrate bombardment step.

3. The method of claim 1 wherein initial ion bombardment for oxidation of the substrate is effected at a pressure up to about 30 microns (mercury), the amount of oxygen present being not less than about 1% by volume of available gases.

4. The method of claim 1 wherein exposure of the oxidized substrate to a vapor cloud of photoconductive material is effected by heating the photoconductive material to an intermediate temperature between room temperature and the maximum photoconductive evaporation, temperature utilizing the substrate as one electrode and the donor source as another electrode under a low frequency AC glow discharge.

5. The method of claim 3 wherein the initial positive ion bombardment of the substrate is effected under an oxygen-containing atmosphere at about 5 – 30 micons (mercury) pressure.

6. The method of claim 4 wherein the photoconductive material is heated by electron bombardment, by ion bombardment or by resistance heating means during photoconductor deposition unto the oxidized substrate.

7. The method of claim 1 wherein the substrate is a charge conductive metal belt and the inorganic ionizable ambipolar photoconductive layer comprises selenium and alloys thereof with one or more of tellurium antimony, bismuth, arsenic and a halogen.

8. The method of claim 1 wherein the substrate is a charge conductive metal belt and the inorganic ionizable photoconductive layer comprises selenium or a selenium-arsenic-halogen alloy.

9. The method of claim 1 wherein photoconductive material is subsequently applied by vapor deposition after depositing photoconductive material onto the substrate under glow discharge to a thickness of at least about 0.01$\mu$.

10. The method of claim 7 wherein the substrate is a nickel belt.

11. The method of claim 8 wherein the substrate is a nickel belt.

12. The method of claim 9 wherein the substrate is a nickel belt.

13. The method of claim 7 wherein the substrate is a brass belt.

14. The method of claim 8 wherein the substrate is a brass belt.

15. The method of claim 9 wherein the substrate is a brass belt.

16. A flexible photoreceptor comprising a metal- or metal-coated substrate and a photoconductive layer of an ionizable inorganic ambipolar photoconductive material in charge blocking contact with the substrate, obtained in accordance with the method of claim 1.

17. A flexible photoreceptor comprising a metal- or metal-coated substrate and a photoconductive layer of an ionizable inorganic ambipolar photoconductive material in charge blocking contact with the substrate, obtained in accordance with the method of claim 2.

18. A flexible photoreceptor comprising a metal- or metal-coated substrate and a photoconductive layer of an ionizable inorganic ambipolar photoconductive material in charge blocking contact with the substrate, obtained in accordance with the method of claim 12.

19. A flexible photoreceptor comprising a metal- or metal-coated substrate and a photoconductive layer of an ionizable inorganic ambipolar photoconductive material in charge blocking contact with the substrate, obtained in accordance with the method of claim 15.

* * * * *